(12) United States Patent
Bagung

(10) Patent No.: US 8,148,642 B2
(45) Date of Patent: Apr. 3, 2012

(54) PRINTED CIRCUIT BOARD AND METHOD FOR FABRICATING A PRINTED CIRCUIT BOARD

(75) Inventor: Detlev Bagung, Bernhardswald (DE)

(73) Assignee: Continental Automotive GmbH, Hannover (DE)

( * ) Notice: Subject to any disclaimer, the term of this patent is extended or adjusted under 35 U.S.C. 154(b) by 398 days.

(21) Appl. No.: 12/413,810

(22) Filed: Mar. 30, 2009

(65) Prior Publication Data

US 2009/0242243 A1 Oct. 1, 2009

(30) Foreign Application Priority Data

Mar. 28, 2008 (DE) .................. 10 2008 016 133

(51) Int. Cl.
*H05K 1/00* (2006.01)
(52) U.S. Cl. ........................................ 174/254
(58) Field of Classification Search .............. 174/254, 174/255, 260, 261; 361/749, 792–795
See application file for complete search history.

(56) References Cited

U.S. PATENT DOCUMENTS

| 6,201,710 | B1 * | 3/2001 | Bagung et al. ............... 361/799 |
| 6,927,344 | B1 | 8/2005 | Gall et al. |
| 2008/0093110 | A1 | 4/2008 | Bagung |

FOREIGN PATENT DOCUMENTS

| DE | 19634371 A1 | 2/1998 |
| DE | 102005012404 A1 | 9/2006 |
| JP | 5335696 A | 12/1993 |

* cited by examiner

*Primary Examiner* — Javaid Nasri
(74) *Attorney, Agent, or Firm* — Laurence A. Greenberg; Werner H. Stemer; Ralph E. Locher

(57) ABSTRACT

A printed circuit board has a first main side and a second main side disposed opposite the first main side. A first and a second rigid zone are linked to each other by way of a flexible zone and the flexible zone is embodied thinner than the first and second rigid zones perpendicular to the first and second main sides. The flexible zone has at least one metallization layer and at least one substrate layer formed of an insulating material and connected to the at least one metallization layer. The substrate layer is formed with a plurality of trenches which in each case extend at the most up to one of the one or more metallization layers.

21 Claims, 3 Drawing Sheets

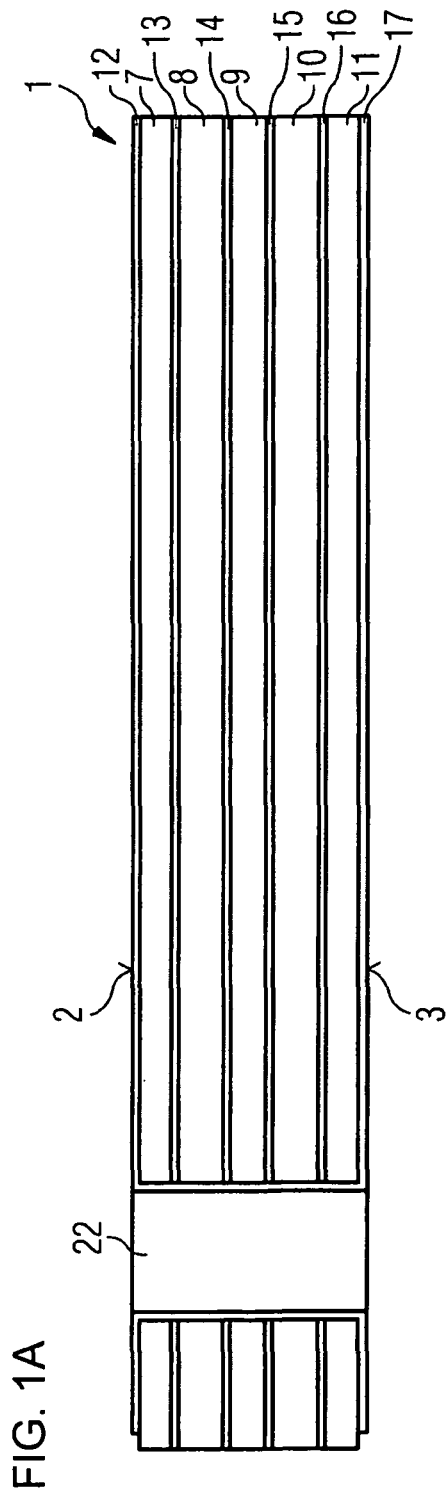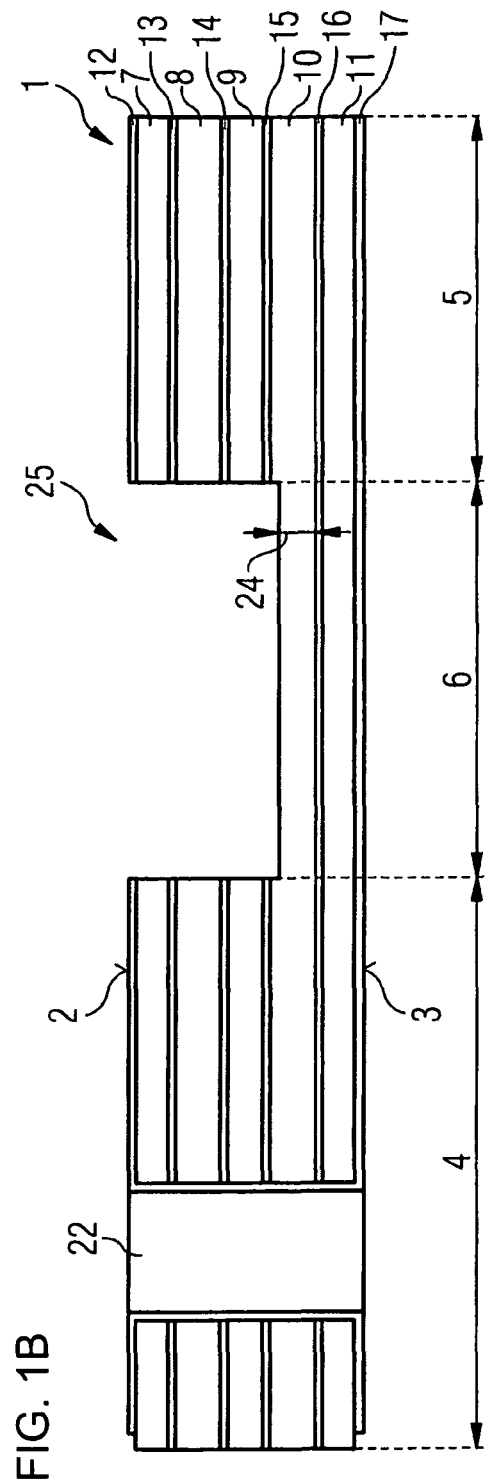
FIG. 1A
FIG. 1B

PRINTED CIRCUIT BOARD AND METHOD FOR FABRICATING A PRINTED CIRCUIT BOARD

CROSS-REFERENCE TO RELATED APPLICATION

This application claims the priority, under 35 U.S.C. §119, of German patent application DE 102008 016 133.0, filed Mar. 28, 2008; the prior application is herewith incorporated by reference in its entirety.

BACKGROUND OF THE INVENTION

Field of the Invention

The invention relates to a printed circuit board which has a first main side and a second main side disposed opposite the first main side, and also a first and a second rigid zone. The first and second rigid zones are linked to each other by way of a flexible zone and the flexible zone is embodied thinner than the first and the second rigid zone perpendicular to the first and the second main side. The invention also relates to a method for fabricating a printed circuit board of the the type.

Printed circuit boards are often embodied in the form of multilayer printed circuit boards. In the case of multilayer printed circuit boards of this kind, patterned metallization layers and insulating substrate layers are arranged alternately one above the other. Such multilayer printed circuit boards allow a greater number of active and passive components to be arranged on the printed circuit board since their electrical connection can be effected by way of interlinking wiring on several levels. To that end, different metallization layers are connected to each other electrically by way of metalized holes or through connections.

In general, a multilayer printed circuit board is rigid and cannot be bent without damaging it. It frequently happens, however, that the printed circuit board has to be adapted in terms of its embodiment and arrangement to external conditions such as e.g. space requirements. To that end it is necessary, for example, to bend the printed circuit board through a certain angle. The printed circuit board then has to include one or more flexible elements which in each case link two rigid printed circuit board sections (rigid zones) to each other and withstand the bending without damage. The flexible element (the so-called flexible zone) can be produced, for example, out of a flexible material such as e.g. polyimide, on one or both sides of which conductor tracks are deposited in order to establish an electrical connection between the components on the printed circuit board sections that are linked to each other. A drawback when polyimide is used is that the material tends to absorb water, with the result that its reliability can be impaired under certain circumstances.

My earlier, commonly assigned German published patent application DE 10 2005 012 404 A1 and its counterpart patent application publication U.S. 2008/0093110 A1 disclose a printed circuit board with a first, a second, and a third rigid zone and at least a first and a second flexible zone. The flexible zones are embodied perpendicular to the main sides of the printed circuit board and thinner than the rigid zones. The first rigid zone is linked to the second rigid zone only by means of the first flexible zone. The second rigid zone is linked to the third rigid zone only by means of the second flexible zone. The first flexible zone is embodied such that it is flush with the first main side of the printed circuit board. The second flexible zone is embodied such that it is flush with the second main side of the printed circuit board. This means that the first rigid zone can be bent in a different direction in relation to the second rigid zone than the second rigid zone in relation to the third rigid zone. In the publication it is proposed to embody the flexible zones by means of deep-milling of the printed circuit board.

An advantage of the printed circuit board described in my earlier applications (DE 10 2005 012 404 A1 and U.S. 2008/0093110 A1) consists in the fact that the flexible zones are produced by using the materials of the rigid zones so that the reliability problems described above, as can occur in the case of using polyimide, can be avoided. On the other hand the fabrication of the flexible zones by way of a milling operation brings with it the problem that the tolerances necessary for fabricating the flexible zones can only be adhered to subject to major manufacturing overhead. This is the case in particular if the flexible zone is to have metallization consisting of at least two layers. In this case the milling operation has to be controlled such that a metallization layer facing the milling zone is not damaged by the milling. The fabrication of printed circuit boards of this type is therefore associated with high costs.

SUMMARY OF THE INVENTION

It is accordingly an object of the invention to provide a printed circuit board and method for producing a printed circuit board, which overcomes the above-mentioned disadvantages of the heretofore-known devices and methods of this general type and which can be fabricated more simply, with at least the same degree of reliability, and more cost-effectively.

With the foregoing and other objects in view there is provided, in accordance with the invention, a printed circuit board, comprising:

a first main side and a second main side opposite the first main side;

first and second rigid zones and a flexible zone linking the first and second rigid zones to one another. the flexible zone being relatively thinner than the first and second rigid zones in a direction perpendicular to the first and second main sides;

the flexible zone including at least one metallization layer and at least one substrate layer formed of an insulating material and connected to the at least one metallization layer; and the substrate layer having a plurality of trenches formed therein, each extending maximally to one of the at least one metallization layer.

In other words, the invention provides a printed circuit board which comprises a first main side and a second main side disposed opposite the first main side. The printed circuit board furthermore comprises a first and a second rigid zone, wherein the first and the second rigid zone are linked to each other by means of a flexible zone, and the flexible zone is embodied thinner than the first and second rigid zones perpendicular to the first and second main sides. The printed circuit board is wherein the flexible zone comprises at least one metallization layer and at least one substrate layer consisting of an insulating material and connected to the at least one metallization layer, the substrate layer comprising a plurality of trenches which in each case extend at the most up to one of the one or more metallization layers.

An advantage of the printed circuit board according to the invention consists in the fact that it can be fabricated more cost-effectively compared with a printed circuit board from the prior art since the fabrication method only requires a low level of precision. Moreover, a flexible zone embodied according to the invention has improved mechanical stability even though the desired flexibility is fully maintained.

In particular, the flexible zone is created by means of a mechanical ablation method and the trenches by means of laser ablation. The mechanical ablation method, in particular a deep-milling method, removes the substrate layers and metallization layers that are not needed in the flexible zone. In this case the mechanical ablation method can be effected with a low level of precision. The trenches are then fabricated in the substrate layer by means of the laser method, the trenches being able to extend in each case up to one of the one or more metallization layers. The laser ablation enables the precision desired for fabricating the "depth" of the flexible zone to be achieved in a simple manner.

The depth of the plurality of trenches is dependent on the wavelength of the laser and the energy injected into the substrate layer. A $CO_2$ laser, and in exceptional cases a UV laser, is primarily employed in this case. Due to reflection at the metallization layer, material from the substrate layer can remain in place on the metallization layer. Where relevant, control of the process can also be effected such that a greater material thickness remains.

In particular, the trenches are embodied so as to be at least largely separated from each other. This means, in other words, that the trenches embodied in the flexible zone usually have no crossovers.

The depth of the trenches is between 30 µm and 150 µm, and in particular between 50 µm and 100 µm. It is advantageous in this case to embody the depth of the trenches as small as possible since the fabrication time for the trenches by means of a laser is proportional to the depth of the trenches. In principle, the width of the trenches can be selected as desired. It has proved advantageous to embody the trenches in particular between 100 µm and 300 µm wide since then a $CO2$ laser can be employed and the production of the printed circuit board can be implemented in an optimized manner on time and cost grounds. With other laser sources or in the case of using lenses and apertures, the width of the trenches can also diverge from this range.

In a further advantageous embodiment, the trenches are oriented so as to run substantially parallel to one another and the spacing between two trenches is greater than or equal to the width of the trenches. This achieves an optimum in terms of the flexibility of the flexible zone, the time and therefore the costs for the fabrication of the flexible zone, and therefore of the printed circuit board.

In particular, the trenches are oriented so as to run substantially perpendicular to one side edge of the first rigid zone and/or a second side edge of the second rigid zone, the first and second side edges of the first and second rigid zones bordering in each case on the flexible zone. Apart from a particularly simple production process, this embodiment produces a particularly high degree of flexibility of the flexible zone in a direction that extends from the first to the second rigid zone.

The substrate layer can be embodied in the form of a core layer consisting of a printed circuit board material or a prepreg layer consisting of printed circuit board material. Suitable candidates for the printed circuit board material are, for example, FR4 or BT (bismaleimide triazine) which constitute a base material for printed circuit boards with plated-through holes. It consists mostly of a glass-fiber fabric which is combined with resin. Metallization layers are then deposited on one or both sides of this hardened substrate material, said metallization layers being provided with the desired metallic patterning prior to their being joined to further substrate layers. Prepreg is the English abbreviation for "preimpregnated fibers." Typically, one or more prepreg layers are arranged between two core layers metallized on both sides. Furthermore, prepreg layers form the outermost substrate layers of a printed circuit board.

In a further advantageous embodiment, the at least one metallization layer comprises conductor tracks which extend from the first rigid zone in the direction of the second rigid zone, the trenches being oriented so as to run perpendicular to the conductor tracks at least in sections. This brings about a stabilization of the flexible zone on the one hand, and a sufficient flexibility in the direction of the extending conductor tracks on the other.

With the above and other objects in view there is also provided, in accordance with the invention, a method for fabricating a printed circuit board as outlined above. The fabrication method comprises the following steps:

mechanically ablating the printed circuit board from a direction of the first main side to partially reduce the at least one substrate layer in a thickness thereof and to form a remaining layer; and subjecting the remaining layer to partial laser ablation to ablate the remaining layer thickness of the substrate layer from the direction of the first main side down to the metallization layer.

In other words, in the case of the inventive method for fabricating a printed circuit board which comprises a first main side and a second main side disposed opposite the first main side, and a first and a second rigid zone, the first and the second rigid zone being linked to each other by means of a flexible zone, and the flexible zone being embodied thinner than the rigid zone perpendicular to the first and second main sides, the flexible zone, which comprises at least one metallization layer and at least one substrate layer consisting of an insulating material and connected to the at least one metallization layer, is fabricated by means of the following steps: a mechanical ablation of the printed circuit board is effected from the direction of the first main side such that the at least one substrate layer is partially reduced in thickness. Then the remaining layer thickness of the substrate layer is at least partially ablated by means of a laser from the direction of the first main side at the most as far as the metallization layer.

The mechanical ablation method, which is in particular a deep-milling method, removes those substrate layers and metallization layers that are not required in the flexible zone. In this case the at least one substrate layer that borders on the at least one remaining metallization layer is only partially reduced in thickness. This means that the mechanical ablation method can be carried out rapidly and with a low level of precision. The ablation of the remaining layer thickness of the substrate layer, which must be effected with a high level of precision in order not to damage the required metallization layer, is then performed by means of the laser ablation method.

The wavelength of the light emitted by the laser is advantageously selected in this case such that an ablation of the metallization layer by the laser does not take place, i.e. is not possible. This ensures that the metallization layer necessary to assure the electrical function is not damaged by the processing method.

The remaining layer thickness of the substrate layer following the mechanical ablation can be completely removed by means of the laser ablation method, with the result that a flexible zone known from the prior art having an essentially flat surface is provided. To speed up the fabrication of the flexible zone and therefore lower the costs of fabrication for the printed circuit board, it is advantageous if the step of the partial ablation of the remaining layer thickness of the substrate layer comprises the incorporation of trenches into the substrate layer which project at the most as far as the metallization layer. This means that just one part of the surface of the remaining layer thickness of the substrate layer needs to be ablated. This partial ablation of the remaining layer thickness is sufficient to ensure the necessary flexibility of the flexible zone. Moreover, a flexible zone embodied with trenches in this manner has a greater mechanical stability.

The trenches are advantageously incorporated into the substrate layer so as to be oriented parallel to each other. This ensures rapid and cost-effective production of the flexible zone. Moreover, the flexibility of the flexible zone transversely to the orientation of the trenches is ensured.

In a further advantageous embodiment, the at least one metallization layer comprises conductor tracks, which extend from the first rigid zone in the direction of the second rigid zone, the trenches being incorporated so as to be oriented perpendicular to the conductor tracks at least in sections.

By means of the mechanical ablation method the layer thickness of the remaining substrate material is advantageously embodied so as to be as small as possible, in particular between 30 µm and 150 µm, ideally between 50 µm and 100 µm, so that the time for the at least partial ablation of the remaining layer thickness by the laser can be kept short.

Other features which are considered as characteristic for the invention are set forth in the appended claims.

Although the invention is illustrated and described herein as embodied in a printed circuit board and method for fabricating a printed circuit board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIGS. 1A to 1C are diagrammatic cross-sectional views illustrating sequential method steps for fabricating a printed circuit board according to the invention.

DETAILED DESCRIPTION OF THE INVENTION

Figure 1C:
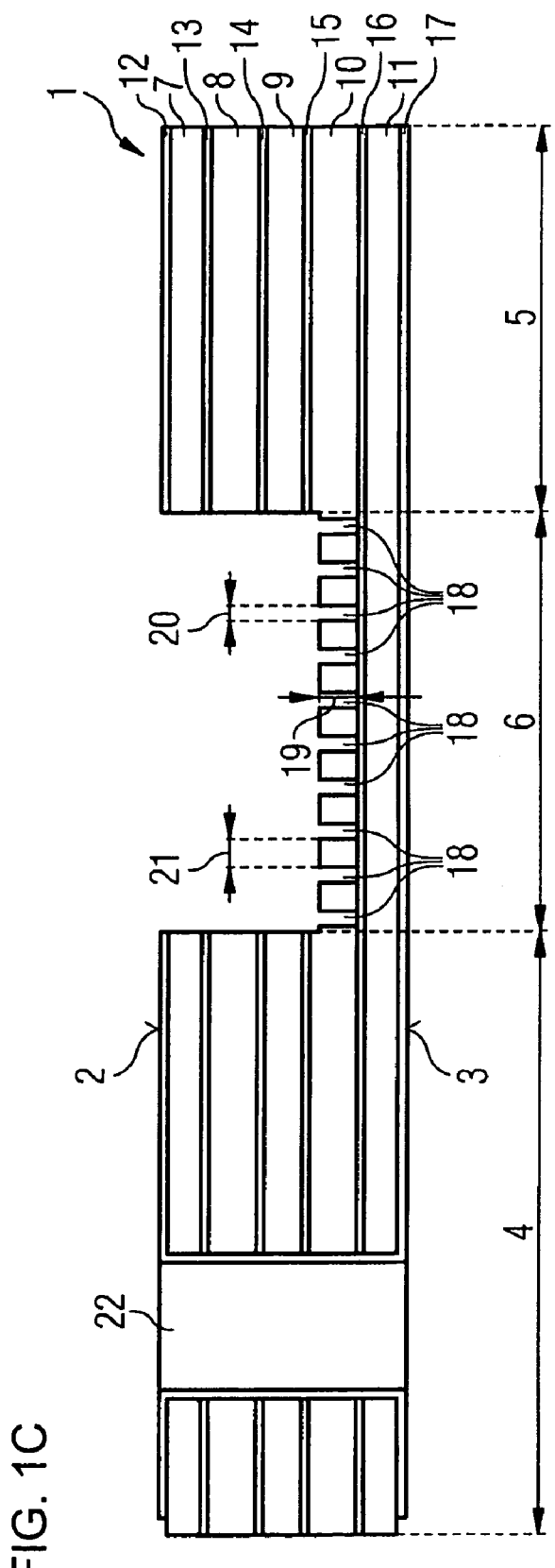

Referring now to the figures of the drawing in detail and first, particularly, to the sequential FIGS. 1A, 1B, and 1C thereof, there are shown various fabrication stages in the fabrication of a printed circuit board 1 according to the invention. The starting point for the fabrication of a printed circuit board 1 according to the invention is a conventional printed circuit board (cf. FIG. 1A) which in the exemplary embodiment comprises five substrate layers 7, 8, 9, 10, 11 and six metallization layers 12, 13, 14, 15, 16, 17 by way of example. In this case the substrate layers 8 und 10 represent so-called core layers consisting of the printed circuit board material FR4, on both sides of which metallization layers 13, 14 and 15, 16 respectively are deposited. Prior to being joined to the substrate layers 7, 9, and 11, which are embodied as so-called prepreg layers consisting of FR4, the metallization layers 13, 14, 15, and 16 are patterned in the desired manner. Following the connection of the core layers 8 and 10, with the metallization layers 13, 14 and 15, 16 respectively deposited on them, to the prepreg layers 7, 9, 11, further metallization layers 12, 17 are deposited on the outer sides of the prepreg layers 7 and 11 and patterned. Once all the substrate layers have been joined together, holes 22 can be incorporated into the printed circuit board 1, which holes can be used as plated-through holes or for later mechanical fixing of the printed circuit board to a substrate.

The printed circuit board 1 shown in FIG. 1A comprises a first main side 2 and a second main side 3. A groove 25 is incorporated into the printed circuit board 1 from the direction of the first main side 2 by means of a mechanical ablation method. The mechanical ablation method can be embodied by means of a deep-milling method, for example. The mechanical ablation method removes all the substrate layers and metallization layers that are not needed in a flexible zone 6 extending over the width of the groove 25. The flexible zone 6 connects a first rigid zone 4 and a second rigid zone 5 of the printed circuit board 1 to each other.

As can be readily seen from FIG. 1B, the mechanical ablation has removed the metallization layers 12, 13, 14, and 15 and also the substrate layers 7, 8, and 9 completely and also the substrate layer 10 partially in the area of the flexible zone 6. In the flexible zone 6, the substrate layer 10 has a thickness 24 which is smaller than the thickness of the substrate layer 10 in the rigid zones 4, 5. In this case the thickness 24 is advantageously between 30 µm and 150 µm, and in particular between 50 µm and 100 µm. During the fabrication of the groove 25, it is not a requirement to produce the thickness 24 of the substrate layer 10 exactly. This means that the mechanical ablation operation in the flexible zone 6 can be effected with a low level of precision.

With regard to the fabrication of the flexible zone 6, a further ablation of the remaining layer thickness 24 of the substrate layer 10 is effected at least partially. This is realized by means of laser processing, where, as can be readily seen in FIG. 1C, trenches 18 oriented so as to run parallel are incorporated into the remaining layer thickness 24. The width of the trenches 18 is labeled with the reference symbol 20 and corresponds, for example, to the width achievable by means of a laser beam. When a C02 laser is used, the width 20 is between 200 µm and 300 µm due to design constraints. The spacing between two trenches 18 can be greater than the width of the trenches 18, as shown in the exemplary embodiment in FIG. 1C. It is advantageous if the spacing between the two trenches is not less than the width of the trenches. The greater the spacing selected between two trenches, the fewer trenches 18 need to be incorporated into the flexible zone 6, with the result that the processing time for fabricating the printed circuit board decreases. In this case the depth 19 of the trenches corresponds to that up to the thickness 24 of the substrate layer 10. In other words, this means that a respective base of the trenches 18 is formed approximately by the metallization layer 16. The wavelength of the laser is selected in this case such that an ablation of the metallization layer 16 does not take place when the laser impinges on the metallization layer. This has the consequence that material of the substrate layer 10 can remain on the metallization layer 16.

The flexible zone 6 therefore, as is plainly apparent from FIG. 1C, is embodied thinner than the first and the second rigid zone 4, 5 perpendicular to the first and the second main side 2, 3. Due to the flexibility of the flexible zone 6, the first rigid zone 4 can be arranged bent in relation to the second rigid zone 5.

Figure 2:
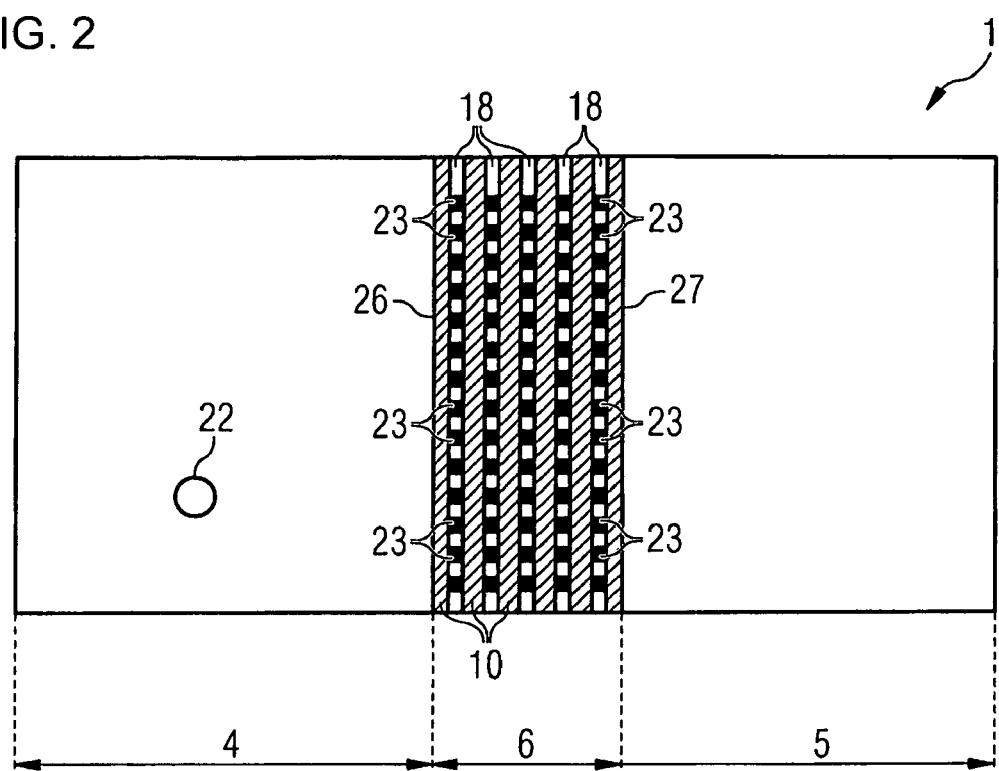
FIG. 2 is a plan view of a printed circuit board according to the invention.

The trenches 18 are oriented so as to run substantially parallel to one another. In this case they occupy a direction that is approximately perpendicular to conductor tracks 23 running between the first and the second rigid zone 4, 5. This can be seen better in FIG. 2. This represents a plan view of the first main side 2 of the printed circuit board 1 according to the invention. The patterning of the metallization layer 12 embodied in the first and second rigid zones 4, 5 is not shown in this case. It can be readily seen that the trenches in the flexible zone 6 are oriented so as to run parallel to each other and parallel to side edges 26, 27 of the first rigid zone 4 and the second rigid zone 5, the first and second side edges 26, 27 of the first and second rigid zones 4, 5 in each case bordering on the flexible zone 6. What can also be readily seen is the orientation of the conductor tracks 23 which are partially exposed in the flexible zone and which extend from the first rigid zone 4 in the direction of the second rigid zone 5.

The method according to the invention has the advantage that the printed circuit board 1 can be fabricated in a more rapid and therefore more cost-effective manner than is possible in the prior art. In particular, there is no need to work to tolerances during the mechanical ablation of the substrate and metallization layers that are not needed. The requisite precision during the fabrication of the flexible zone is ensured by means of laser processing, such that the metallization layer 16 bordering on the groove 25 is not damaged by the processing method. By means of the method trenches are created resulting in the flexible zone having a V-belt-like shape in cross-section (cf. FIG. 1C).

In the exemplary embodiment described in the figures, the printed circuit board 1 is embodied with six layers, with the flexible zone 6 having two layers. Embodiments diverging from this are also encompassed by the invention.

In a further exemplary embodiment not shown in more detail in the figures, the remaining layer thickness 24 of the substrate layer 10 can also be completely removed by means of the laser method such that the flexible zone 6 is embodied by means of the substrate layer 11 and the metallization layers 16 und 17 arranged on both sides thereof. This provides a printed circuit board that is functionally identical to the exemplary embodiment described, although a longer processing time is necessary due to the complete removal of the substrate layer 10 in the area of the flexible zone 6 by means of the laser.

The invention claimed is:

1. A printed circuit board, comprising:
   a first main side and a second main side opposite said first main side;
   first and second rigid zones and a flexible zone linking said first and second rigid zones to one another, said flexible zone being relatively thinner than said first and second rigid zones in a direction perpendicular to said first and second main sides;
   said flexible zone including at least one metallization layer and at least one substrate layer formed of an insulating material and connected to said at least one metallization layer; and
   said substrate layer having a plurality of trenches formed therein, each extending maximally to one of said at least one metallization layer.

2. The printed circuit board according to claim 1, wherein said trenches are at least largely separated from each other.

3. The printed circuit board according to claim 1, wherein said trenches have a depth of between 30 μm and 150 μm.

4. The printed circuit board according to claim 3, wherein said depth of said trenches lies between 50 μm and 100 μm.

5. The printed circuit board according to claim 1, wherein said trenches have a width between 100 μm and 300 μm.

6. The printed circuit board according to claim 1, wherein said trenches are oriented to run substantially parallel to one another and a spacing between adjacent said trenches is greater than or equal to a width of said trenches.

7. The printed circuit board according to claim 1, wherein said trenches are oriented to run substantially perpendicular to a first side edge of said first rigid zone and/or to a second side edge of said second rigid zone, and wherein said first and second side edges of said first and second rigid zones in each case border on said flexible zone.

8. The printed circuit board according to claim 1, wherein said substrate layer is a core layer formed of a printed circuit board material or a prepreg layer formed with the printed circuit board material.

9. The printed circuit board according to claim 8, wherein said substrate layer consists of FR4.

10. The printed circuit board according to claim 1, wherein said at least one metallization layer comprises conductor tracks which extend from said first rigid zone in a direction towards said second rigid zone, and said trenches are oriented to run perpendicular to said conductor tracks, at least in sections.

11. The printed circuit board according to claim 1, wherein said flexible zone is a mechanically ablated zone and said trenches are laser-ablation trenches.

12. The printed circuit board according to claim 1, wherein said substrate layer has material that defines a plurality of side surfaces of said plurality of trenches.

13. A method for fabricating a printed circuit board having a first main side and a second main side opposite the first main side, first and second rigid zones linked to one another by way of a flexible zone, which is thinner than the first and second rigid zones in a direction perpendicular to the first and second main sides, the flexible zone having at least one metallization layer and at least one substrate layer formed of an insulating material and connected to the at least one metallization layer, the method for fabricating the printed circuit board comprising the following steps:
   mechanically ablating the printed circuit board from a direction of the first main side to partially reduce the at least one substrate layer in a thickness thereof and to form a remaining layer; and
   subjecting the remaining layer to partial laser ablation to ablate the remaining layer thickness of the substrate layer from the direction of the first main side down to a first surface of the metallization layer, wherein the laser ablation of the remaining layer thickness of the substrate layer stops at the first surface of the metallization layer, and the first surface of the metallization layer is closer to the first main side than a second surface of the metallization layer.

14. The method according to claim 13, which comprises selecting a wavelength of a light emitted by the laser in the laser ablation so that an ablation of the metallization layer is not possible.

15. The method according to claim 13, wherein the partial laser ablation of the remaining layer thickness of the substrate layer comprises forming trenches into the substrate layer reaching as far as the metallization layer.

16. The method according to claim 15, which comprises forming the trenches into the substrate layer to be oriented parallel to one another.

17. The method according to claim 15, wherein the at least one metallization layer comprises conductor tracks which extend from the first rigid zone in a direction towards the second rigid zone, and the trenches are incorporated so as to be oriented perpendicular to the conductor tracks at least in sections.

18. The method according to claim 13, wherein the step of mechanically ablating comprises forming a remaining substrate material to have a layer thickness as small as possible.

19. The method according to claim 18, which comprises forming the remaining layer to a thickness between 30 μm and 150 μm.

20. The method according to claim 18, which comprises forming the remaining layer to a thickness between 50 μm and 100 μm.

21. The method according to claim 13, wherein the step of mechanically ablating comprises employing a deep-milling process.

* * * * *